US011552271B2

(12) United States Patent
Sun et al.

(10) Patent No.: US 11,552,271 B2
(45) Date of Patent: Jan. 10, 2023

(54) MASK PLATE FOR FABRICATING DISPLAY PANEL AND APPLICATION THEREOF

(71) Applicant: Wuhan China Star Optoelectronics Semiconductor Display Technology Co., Ltd., Wuhan (CN)

(72) Inventors: Liang Sun, Wuhan (CN); Mian Zeng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/630,469

(22) PCT Filed: Sep. 10, 2019

(86) PCT No.: PCT/CN2019/105165
§ 371 (c)(1),
(2) Date: Jan. 13, 2020

(87) PCT Pub. No.: WO2021/022616
PCT Pub. Date: Feb. 11, 2021

(65) Prior Publication Data
US 2022/0155831 A1 May 19, 2022

(30) Foreign Application Priority Data
Aug. 2, 2019 (CN) .......................... 201910709919.0

(51) Int. Cl.
*G06F 1/16* (2006.01)
*H01L 51/52* (2006.01)
*H01L 27/32* (2006.01)

(52) U.S. Cl.
CPC ........ *H01L 51/5225* (2013.01); *G06F 1/1686* (2013.01); *H01L 27/3234* (2013.01)

(58) Field of Classification Search
CPC ............................... G06F 3/189; G06F 1/1686
USPC ........................................................ 348/294
See application file for complete search history.

(56) References Cited

U.S. PATENT DOCUMENTS

| 10,615,305 | B1* | 4/2020 | Oyer .................. H01L 27/15 |
| 2018/0374908 | A1* | 12/2018 | Li .................. H01L 27/3206 |
| 2018/0375027 | A1 | 12/2018 | Zhang et al. |
| 2019/0245022 | A1* | 8/2019 | Zhou .................. H01L 51/5221 |
| 2020/0075697 | A1 | 3/2020 | Xu et al. |

FOREIGN PATENT DOCUMENTS

| CN | 107204358 A | 9/2017 |
| CN | 108336117 A | 7/2018 |
| CN | 108441816 A | 8/2018 |
| CN | 108866476 A | 11/2018 |
| CN | 109306448 A | 2/2019 |

(Continued)

*Primary Examiner* — Calvin C Ma
(74) *Attorney, Agent, or Firm* — Nathan & Associates; Menachem Nathan

(57) ABSTRACT

A mask plate for fabricating a display panel and an application thereof are provided. The mask plate is configured to vapor-deposit a metal cathode layer of the display panel and includes a first blocking region and a first opening region disposed in the first blocking region, wherein a second blocking region is disposed in the first opening region, and the second blocking region is provided with a plurality of second opening regions spaced apart from each other.

11 Claims, 5 Drawing Sheets

(56) References Cited

FOREIGN PATENT DOCUMENTS

| CN | 109786582 A | 5/2019 |
| CN | 209071332 U | 7/2019 |
| KR | 20150071510 A | 6/2015 |
| WO | 2018086355 A1 | 5/2018 |

* cited by examiner

MASK PLATE FOR FABRICATING DISPLAY PANEL AND APPLICATION THEREOF

FIELD OF INVENTION

The present invention relates to the field of display panel technologies, and in particular, to a mask plate for fabricating a display panel process and an application thereof.

BACKGROUND OF INVENTION

With continuous development of mobile phone industry, mobile phone display technology has also continuously developed, and functions on display screens have also increased. Present mobile phone displays have been popularized by camera modules. Since a camera device needs to be placed away from the display screen, a region available for placing the display screen is reduced, which is contrary to the development trend of increasing screen-to-body ratio of current smartphones. The camera device is an indispensable component of today's mobile phones, and how to integrate a camera with the display screen to maximize screen ratio is an urgent problem that needs to be solved.

At present, there is a higher screen-to-body ratio requirement on the market. Although there is no real product listed, each provider is already developing. The development idea is to dig a hole on screens, place a front camera, hide a camera module in the display panels, and in order to ensure that camera module can receive more light, it is necessary to have high light transmittance and uniformity requirements of laminated layers of display panels.

In an under-screen camera technology, a special design will be made above the camera to increase transmittance of this region, such as reducing pixel density (pixels per inch, PPI) of this region and resizing some metal film layers to form some array of light-transmission regions. In conventional art, a material of cathode layers in active matrix organic light-emitting diode (AMOLED) display devices is generally a magnesium-silver alloy, which transmittance is low, merely about 40% to 50%. The cathode layer is formed by vapor deposition on an entire surface using an open mask plate, and an entire display screen is fully covered. Please refer to FIG. 1, FIG. 1 is a schematic diagram showing a mask plate configured to vapor-deposit the cathode layer in the conventional art, which includes a first opening region 100 corresponding to the entire display screen. The existence of the cathode layer is one of the most important factors affecting transmittance of a camera region.

Therefore, it is indeed necessary to develop a new type of mask plate for fabricating display panels to overcome deficiencies in the conventional art.

Technical Problem

An object of the present invention is to provide a mask plate for fabricating display panels which can solve the problem of low transmittance in the camera region of the conventional under-screen camera technology due to existence of the cathode layer.

SUMMARY OF INVENTION

Technical Solution

In order to achieve the above object, the present invention provides a mask plate for fabricating a display panel. The mask plate is configured to deposit a metal cathode layer of the display panel by vapor deposition, and the mask plate includes a first blocking region, wherein a first opening region is provided in the first blocking region, a second blocking region is disposed in the first opening region, and a plurality of second opening regions are provided spaced apart from each other in the second blocking region.

Further, in an embodiment, a shape of the second opening region is selected from one of a circle, a hexagon, or a quadrilateral.

Further, in an embodiment, a shape of the second blocking region is selected from one of a U-shaped, a rectangle, or a semicircle.

Further, in an embodiment, a number of the second blocking regions is two or more.

To achieve the above object, the present invention also provides a vapor deposition method for a metal cathode layer of a display panel, including steps of:

step S1, providing a substrate of a display panel;

step S2, performing a vapor deposition of the metal cathode layer of the display panel on the substrate by using the mask plate according to present invention.

Further, in an embodiment, the metal cathode layer is formed in the first opening region and the second opening region, a shaded region of the metal cathode layer is formed outside the second opening region, and the shaded region surrounds the second opening region when performing the vapor deposition in the step S2.

Further, in an embodiment, a distance between two adjacent second opening regions is less than twice a width of the shadow region.

To achieve the above object, the present invention further provides a display panel including a substrate and a metal cathode layer disposed on the substrate; wherein a surface of the display panel is defined with a display region and a function region; wherein the function region includes light-emitting regions and light-transmission regions, the light-emitting regions form a hole array in the function region, and the metal cathode layer covers the display region and the light-emitting regions.

Further, in an embodiment, the light-emitting regions include a first light-emitting region and a second light-emitting region surrounding the first light-emitting region, and a thickness of the metal cathode layer on the second light-emitting region is less than a thickness of the metal cathode layer on the first light-emitting region.

Further, in an embodiment, a distance between two adjacent first light-emitting regions is less than twice a width of the second light-emitting region.

Further, in an embodiment, a thickness of the metal cathode layer on a region where adjacent second light-emitting regions overlap each other is greater than the thickness of the metal cathode layer on the first light-emitting region.

Further, in an embodiment, an electronic component is disposed at a position under the display panel and corresponding to the function region.

Further, in an embodiment, the electronic component includes a camera module or a photosensor unit.

Beneficial Effect

Compared with the conventional art, the present invention has beneficial effects that the present invention provides the mask plate for fabricating the display panel and application thereof, which the mask plate combines the open mask plate and the fine metal mask plate. The display panel fabricated by the mask plate has no metal cathode layer in light-transmission regions of the under-screen camera region, which avoids influence of the metal cathode layer on transmittance of the under-screen camera region, and improves light transmittance of electronic components under the substrate, so that the under-screen camera has better imaging results.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
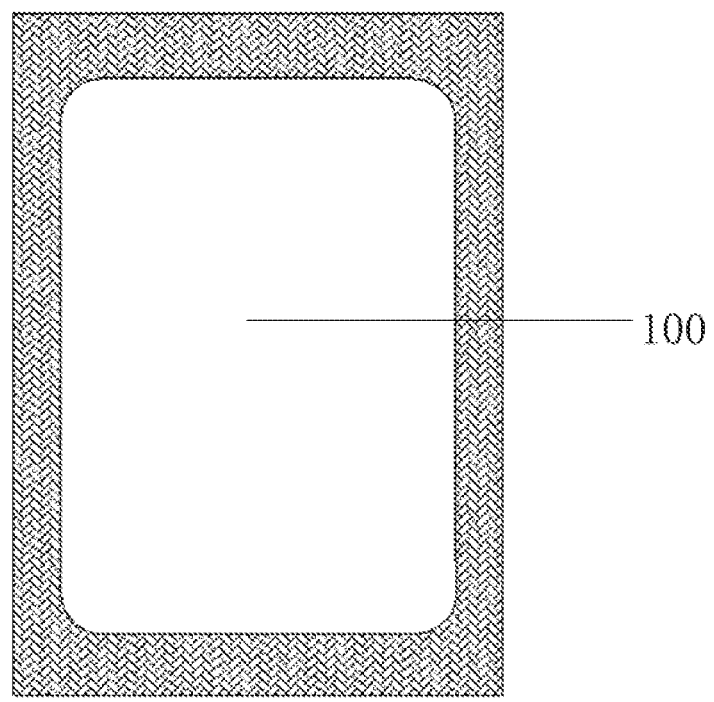
FIG. 1 is a schematic top plane view of a mask plate in conventional art.

The following content combines with the drawings and the embodiment for describing the present invention in detail. It is obvious that the following embodiments are only some embodiments of the present invention. For the skilled persons of ordinary skill in the art without creative effort, the some embodiments obtained thereby are still covered by the present invention.

The specific structural and functional details disclosed here are merely representative and are for the purpose of describing exemplary embodiments of the invention. The present invention may be embodied in many alternate forms and should not be construed as being limited to the embodiments set forth herein.

In the description of the present invention, it is to be understood that the terms "center", "lateral", "upper", "lower", "left", "right", "vertical", "horizontal", "top", "bottom", "inside", "outside", and the like is based on the orientation or positional relationship shown in the drawings, and is merely for convenience of describing the present invention and simplifying the description, and does not indicate or imply the indicated device or the components must have a particular orientation, or operated in a particular orientation and construction, and thus are not to be construed as limiting the invention. Furthermore, the terms "first" and "second" are used for descriptive purposes only and are not to be construed as indicating or implying a relative importance or implicitly indicating the number of technical features indicated. Thus, features defined as "first" or "second" may include one or more of the features either explicitly or implicitly. In the description of the present invention, the meaning of "a plurality" is two or more unless otherwise specified. In addition, the term "includes" and its variations are intended to cover a non-exclusive inclusion.

First Embodiment

Figure 2:
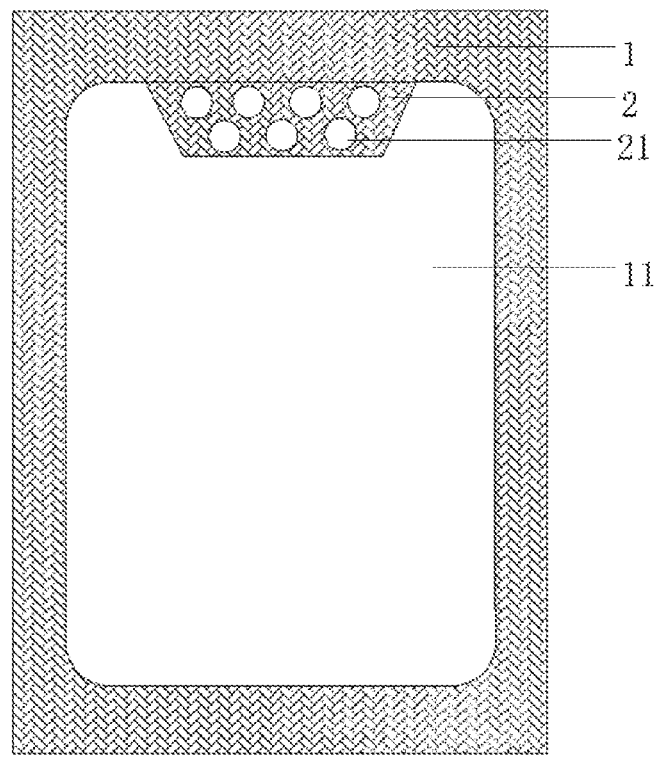
FIG. 2 is a schematic top plane view of a mask plate according to a first embodiment of the present invention.

The present embodiment provides a mask plate. Please refer to FIG. 2, FIG. 2 is a schematic top plane view of a mask plate according to the embodiment, which includes a first blocking region 1, a first opening region 11 disposed in the first blocking region 1, a second blocking region 2 disposed in the first opening region 11, and the second blocking region 2 provided with a plurality of second opening regions 21 spaced apart from each other.

The first blocking region 1 is an open mask plate, and the second blocking region 2 is a fine metal mask plate.

In the embodiment, a shape of the second opening region 21 is a circle. In some embodiments, the shape of the second opening region 21 can be a hexagon or a quadrilateral, which can be determined as needed, and is not limited herein.

In this embodiment, the shape of the second blocking region 2 is a U-shaped, and the second blocking region 2 is positioned directly above the first opening region 11.

In some embodiments, number of the second blocking regions 2 is two or more.

The present invention further provides a vapor deposition method for a metal cathode layer of a display panel, which includes the following steps:

step S1: providing a substrate of a display panel;

step S2: performing a vapor deposition of the metal cathode layer of the display panel on the substrate using the mask plate pertaining to this embodiment.

Figure 3:
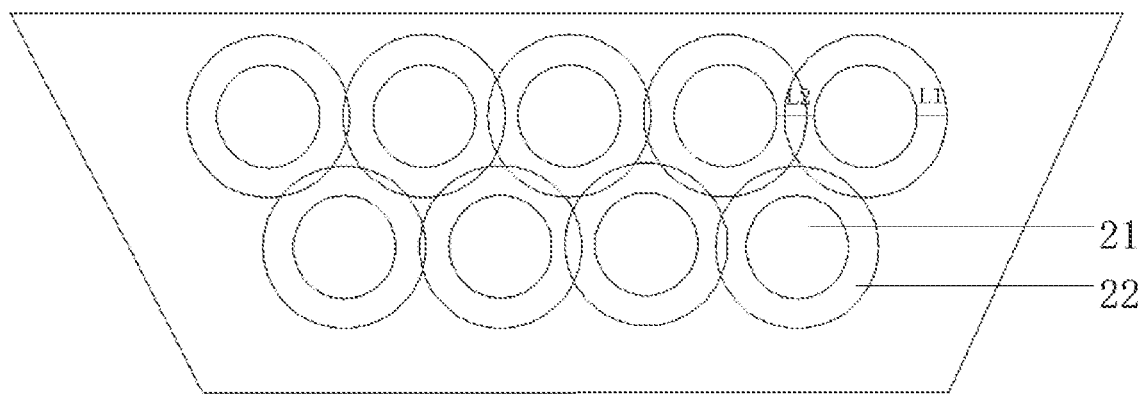
FIG. 3 is a schematic top plane view of a second blocking region according to the first embodiment of the present invention.

In the step S2, when the vapor deposition is performed, the metal cathode layer is formed in the first opening region 11 and the second opening regions 21, also a shaded region outside the second opening region 21. Please refer to FIG. 3, FIG. 3 is a schematic top plane view of the second blocking region 21 according to this embodiment, which the second opening regions 21 are arranged in an array, and each of the second opening regions 21 is surrounded by the shaded region 22.

Meanwhile, a width of the shaded region 22 is L1, and a distance between adjacent second opening regions 21 is L2. The mask plate provided in this embodiment is configured to vapor-deposit the metal cathode layer of the display panel. The metal cathode layer is used as electrodes for inputting a common voltage for driving the display panel, and the second opening regions 21 are spaced apart from each other, therefore, as the metal cathode layer for the electrodes, an overlapping portion of the adjacent shaded regions 22 is arranged to input the common voltage to each independent light-emitting pixel region.

In this embodiment, a distance L2 between the adjacent second opening regions 21 is less than twice the width L1 of the shaded region 22. This arrangement ensures that the metal cathode layer electrodes are connected to each other and can be inputted the common voltage to each of independent light-emitting pixel regions in a function region 20.

Figure 4:
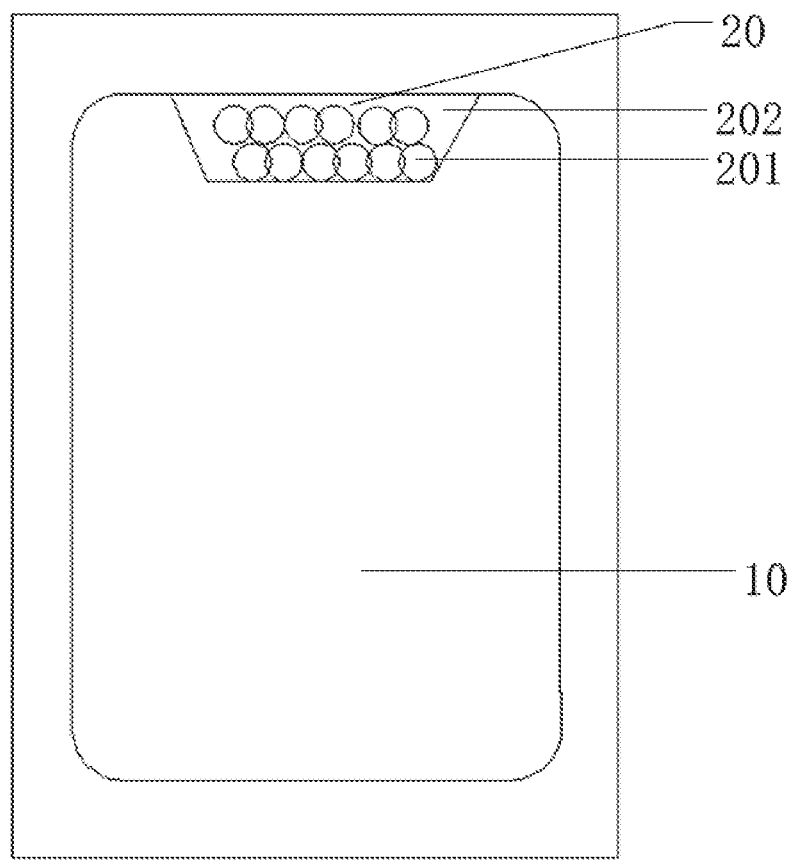
FIG. 4 is a schematic top plane view of a display panel according to the first embodiment of the present invention.

The present invention further provides a display panel. Referring to FIG. 4, FIG. 4 is a schematic top plane view of the display panel according to an embodiment of the present invention, which includes a display region 10 and the function region 20. The function region 20 includes light-emitting regions 201 and light-transmission regions 202, and the light-emitting regions 201 are provided with a hole array in the function region 20.

Figure 5:
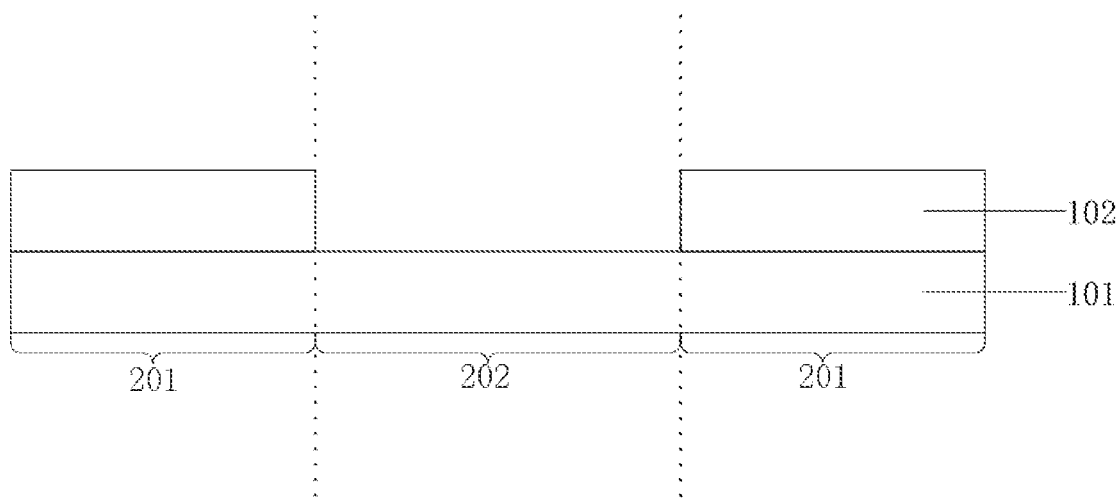
FIG. 5 is a cross-sectional structural view of a function region of the display panel according to the first embodiment of the present invention.

The metal cathode layer of the display panel is formed by the vapor deposition method according to the embodiment of the present invention. The metal cathode layer is disposed in the display region 10 and the light-emitting regions 201. Referring to FIG. 5, FIG. 5 is a schematic cross-sectional structural view of the function region of the display panel according to this embodiment. Each of the light-emitting regions 201 includes the substrate 101 and the metal cathode layer 102 which are sequentially disposed, and each of the light-transmission regions 202 includes the substrate 101.

During fabricating the metal cathode layer 102, the first blocking region 1 corresponds to the display region 10, and the second blocking region 2 corresponds to the function region 20. When the vapor deposition is performed, the metal cathode layer is formed in the first opening region 11 and the second opening regions 21, and the metal cathode layer 102 is also formed the shaded region 22 outside each of the second opening regions 21.

Figure 6:
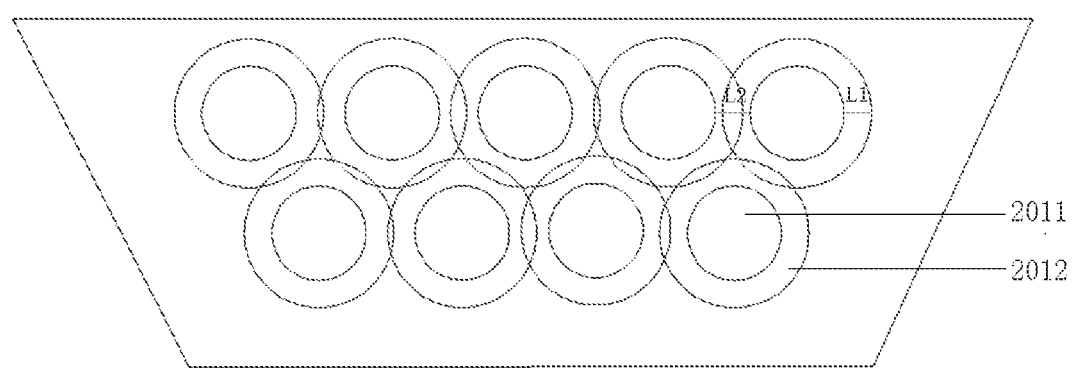
FIG. 6 is a schematic top plane view of the function region according to the first embodiment of the present invention.

Please refer to FIG. 6, FIG. 6 is a schematic top plane view of the function region provided by an embodiment of the present invention. The light-emitting region 201 of the display panel include a first light-emitting region 2011 and a second light-emitting region 2012 surrounding the first light-emitting region 2011, the opening region 21 corresponds to the first light-emitting region 2011, the shaded region 22 corresponds to the second light-emitting region 2012, and a thickness of the metal cathode layer 102 on the second light-emitting region 2012 is less than a thickness of the metal cathode layer 102 on the first light-emitting region 2011.

Meanwhile, a width of the second light-emitting region 2012 is L1, and a distance between adjacent first light-emitting regions 2011 is L2. The mask plate provided in this embodiment is configured to vapor-deposit the metal cathode layer of the display panel. The metal cathode layer is used as electrodes for inputting a common voltage for driving the display panel, as the metal cathode layer for the electrodes, an overlapping portion of the adjacent second light-emitting regions 2012 is arranged to input the common voltage to each independent light-emitting pixel region.

In this embodiment, a distance L2 between the adjacent first light-emitting regions 2011 is less than twice the width L1 of the second light-emitting regions 22. This arrangement ensures that the metal cathode layer electrodes are connected to each other and can be inputted the common voltage to each of independent light-emitting pixel regions in the function region 20.

Meanwhile, a thickness of the metal cathode layer 102 on the region where the adjacent second light-emitting regions 2012 overlap each other is greater than a thickness of the metal cathode layer 102 on the first light-emitting regions 2011.

In some embodiments, electronic components are disposed under the display panel corresponding to the function region 20. The electronic component can be a camera module, a photosensor unit, or a fingerprint recognition device, which can be determined as needed, and is not limited herein.

The number, shape, and position of the function region 20 correspond one-to-one to the number, shape, and position of the second blocking region 2 of the mask plate.

In this embodiment, the shape of the second blocking region 2 is a U-shaped and is positioned in front of the first blocking region 1. Therefore, the shape of the function region 20 on the display panel fabricated by the mask plate provided by this embodiment is also a U-shaped and is positioned in front of the display panel.

In some embodiments, the shape of the function region 20 is a circle, a rectangle, or a semicircle. The number of function regions 20 is two or more, and the function region 20 is positioned in front of or at top left of the display panel. In some embodiments, the number, shape, and position of the function region 20 are determined as needed, and are not limited herein.

In this embodiment, the light-transmission regions 202 of the display panel without the metal cathode layer 102, which avoids influence of the metal cathode layer 102 on transmittance of the function region 20, and improves light transmittance of electronic components under the substrate, so that the under-screen camera has better imaging results.

In the conventional art, the metal cathode layer is formed by vapor deposition on an entire surface of display panel by the open mask plate, and entire display region is completely evaporated. However, the present invention provides the mask plate which combines the open mask plate and the fine metal mask plate. The display panel fabricated by the mask plate has no metal cathode layer in light-transmission regions of the under-screen camera region, which avoids influence of the metal cathode layer on transmittance of the under-screen camera region, and improves light transmittance of electronic components under the substrate, so that the under-screen camera has better imaging results.

Second Embodiment

Figure 7:
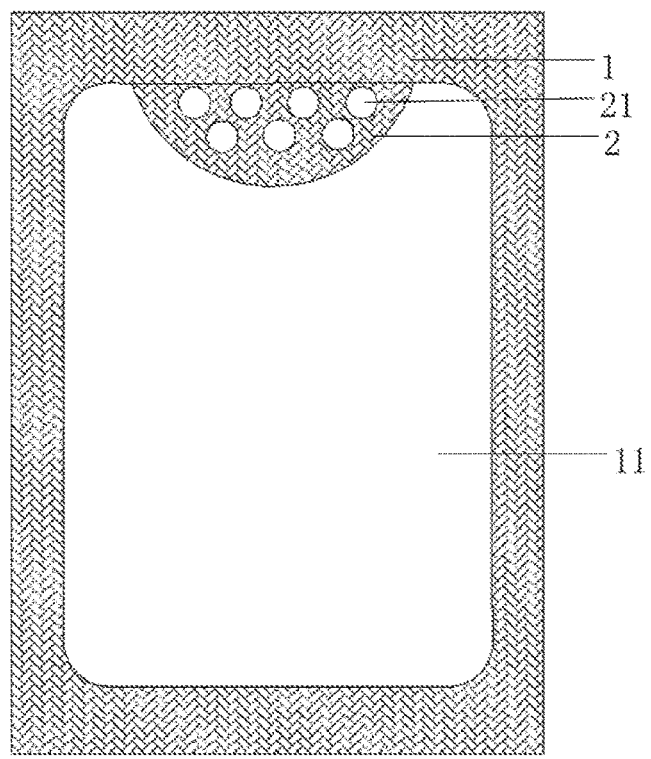
FIG. 7 is a schematic top plane view of a mask plate according to a second embodiment of the present invention.

This embodiment provides a mask plate, refer to FIG. 7, FIG. 7 is a schematic top plane view of the mask plate according to this embodiment of the present invention. The mask plate structure in this embodiment is substantially same as that in the first embodiment, similar structure can be referred to above description, and details are not described herein again. The main difference is that, in this embodiment, the shape of the second blocking plate 2 is a semicircle, and the second blocking region 2 is positioned in front of the first opening region 11.

Third Embodiment

Figure 8:
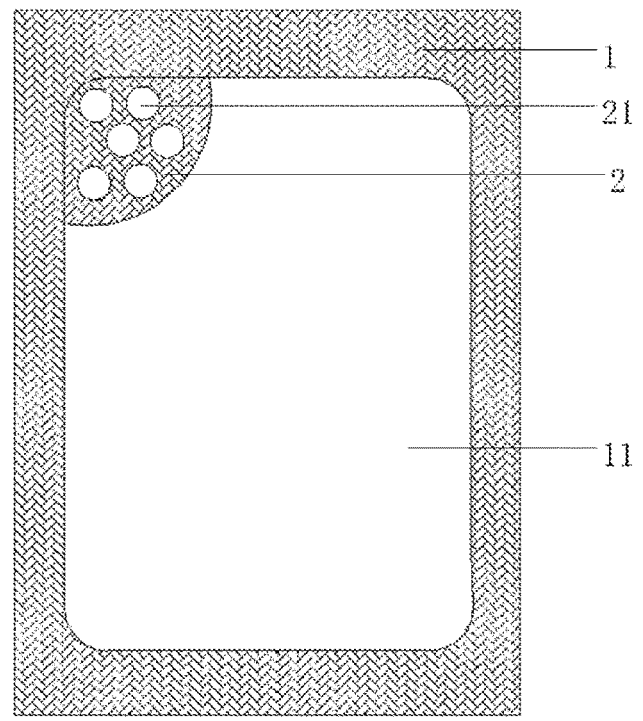
FIG. 8 is a schematic top plane view of a mask plate according to third embodiment of the present invention.

This embodiment provides a mask plate, refer to FIG. 8, FIG. 8 is a schematic top plane view of the mask plate according to this embodiment. The mask plate structure in this embodiment is substantially same as that in the first embodiment, similar structure can be referred to above description, and details are not described herein again. The main difference is that, in this embodiment, the shape of the second blocking plate 2 is a semicircle, and the second blocking region 2 is positioned at top left of the first opening region 11.

Fourth Embodiment

Figure 9:
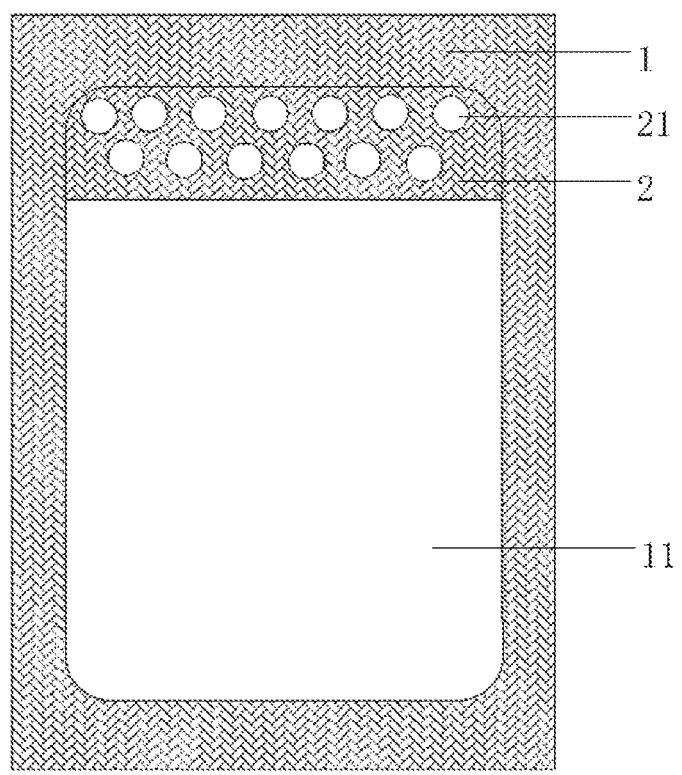
FIG. 9 is a schematic top plane view of a mask plate according to a fourth embodiment of the present invention.

This embodiment provides a mask plate, refer to FIG. 9, FIG. 9 is a schematic top plane view of the mask plate according to this embodiment. The mask plate structure in this embodiment is substantially same as that in the first embodiment, similar structure can be referred to above description, and details are not described herein again. The main difference is that, in this embodiment, the shape of the second blocking plate 2 is a rectangle, and the second blocking region 2 is positioned in front of the first opening region 11.

The present invention has beneficial effects that the present invention provides the mask plate for fabricating the display panel and application thereof, which the mask plate combines the open mask plate and the fine metal mask plate. The display panel fabricated by the mask plate has no metal cathode layer in light-transmission regions of the under-screen camera region, which avoids influence of the metal cathode layer on transmittance of the under-screen camera region, and improves light transmittance of electronic components under the substrate, so that the under-screen camera has better imaging results.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A mask plate for fabricating an OLED display panel, wherein the mask plate is configured to deposit a metal cathode layer of the OLED display panel by vapor deposition, and the mask plate comprises a first blocking region, wherein a first opening region is provided in the first blocking region, a second blocking region connected to the first blocking region is disposed in the first opening region, and a plurality of second opening regions are provided and spaced apart from each other in the second blocking region.

2. The mask plate according to claim 1, wherein a shape of the second opening region is selected from one of a circle, a hexagon, or a quadrilateral.

3. The mask plate according to claim 1, wherein a shape of the second blocking region is selected from one of a U-shaped, a rectangle, or a semicircle.

4. The mask plate according to claim 1, wherein a number of the second blocking regions is two or more.

5. The mask plate according to claim 1, wherein the first blocking region is an open mask plate, and the second blocking region is a fine metal mask plate.

6. An OLED display panel, comprising:
a substrate; and
a metal cathode layer disposed on the substrate;
wherein a surface of the OLED display panel is defined with a display region and a function region connected to the display region, an electronic component is disposed under the OLED display panel and corresponding to the function region; and
wherein the function region comprises light-emitting regions and light-transmission regions, a hole array is defined in the function region and defines the light-emitting regions, and the metal cathode layer covers the display region and the light-emitting regions but does not cover the light-transmission regions.

7. The OLED display panel according to claim 6, wherein the light-emitting regions comprise a first light-emitting region and a second light-emitting region surrounding the first light-emitting region, and a thickness of the metal cathode layer on the second light-emitting region is less than a thickness of the metal cathode layer on the first light-emitting region.

8. The OLED display panel according to claim 7, wherein a distance between two adjacent first light-emitting regions is less than twice a width of the second light-emitting region.

9. The OLED display panel according to claim 8, wherein a thickness of the metal cathode layer on a region where adjacent second light-emitting regions overlap each other is greater than the thickness of the metal cathode layer on the first light-emitting region.

10. The OLED display panel according to claim 7, wherein the electronic component is a camera module or a photosensor unit.

11. A display panel, comprising:
a substrate; and
a metal cathode layer disposed on the substrate;
wherein a surface of the display panel is defined with a display region and a function region, the function region comprises light-emitting regions and light-transmission regions, the light-emitting regions form a hole array in the function region, and the metal cathode layer covers the display region and the light-emitting regions; the light-emitting regions comprise a first light-emitting region and a second light-emitting region surrounding the first light-emitting region, and a thickness of the metal cathode layer on the second light-emitting region is less than a thickness of the metal cathode layer on the first light-emitting region.

* * * * *